United States Patent
Miyake

(10) Patent No.: US 9,001,242 B2
(45) Date of Patent: Apr. 7, 2015

(54) SOLID-STATE IMAGING DEVICE AND IMAGING DEVICE

(71) Applicant: Panasonic Corporation, Osaka (JP)

(72) Inventor: Yasuo Miyake, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 31 days.

(21) Appl. No.: 13/709,997

(22) Filed: Dec. 10, 2012

(65) Prior Publication Data

US 2013/0100328 A1    Apr. 25, 2013

Related U.S. Application Data

(63) Continuation of application No. PCT/JP2011/004098, filed on Jul. 20, 2011.

(30) Foreign Application Priority Data

Jul. 22, 2010  (JP) ................................ 2010-165247

(51) Int. Cl.
  *H04N 3/14* (2006.01)
  *H04N 5/335* (2011.01)
  *H01L 27/148* (2006.01)
  *H04N 5/353* (2011.01)
  *H04N 5/3745* (2011.01)
  *H04N 5/235* (2006.01)

(52) U.S. Cl.
  CPC ............ *H01L 27/148* (2013.01); *H04N 5/3532* (2013.01); *H04N 5/3745* (2013.01); *H04N 5/335* (2013.01); *H04N 5/2353* (2013.01)

(58) Field of Classification Search
  USPC ......... 348/294–324; 250/208.1; 257/290–292
  See application file for complete search history.

(56) References Cited

U.S. PATENT DOCUMENTS

| | | | |
|---|---|---|---|
| 6,542,194 B1 | 4/2003 | Juen | |
| 7,630,009 B2 | 12/2009 | Arishima et al. | |
| 8,159,578 B2 | 4/2012 | Arishima et al. | |
| 2006/0087573 A1* | 4/2006 | Harada | ........................ 348/294 |
| 2008/0309806 A1 | 12/2008 | Arishima et al. | |

(Continued)

FOREIGN PATENT DOCUMENTS

| | | |
|---|---|---|
| JP | 11-041523 A | 2/1999 |
| JP | 2005-130344 A | 5/2005 |

(Continued)

OTHER PUBLICATIONS

International Search Report issued in International Patent Application No. PCT/JP2011/004098 dated Aug. 16, 2011.

*Primary Examiner* — Yogesh Aggarwal
(74) *Attorney, Agent, or Firm* — McDermott Will & Emery LLP

(57) ABSTRACT

A solid-state imaging device simultaneously completes pixel reset operation on all of pixels included in a unit cell when performing pixel reset scanning in a curtain shutter synchronous mode. The pixel reset operation is processing in which a photodiode corresponding to one of transfer transistors is reset. The pixel reset scanning is processing in which the pixel reset operation is performed on a row basis. The curtain shutter synchronous mode is a mode in which exposure of an imaging region to incident light is started by the pixel reset scanning and ended by blocking the incident light by a mechanical curtain shutter provided on an optical path of the incident light.

6 Claims, 16 Drawing Sheets

(56) References Cited

U.S. PATENT DOCUMENTS

2009/0268083 A1  10/2009  Arishima et al.
2010/0188541 A1* 7/2010  Mabuchi et al. ............ 348/302
2014/0042302 A1* 2/2014  Yanagita et al. ........... 250/208.1

FOREIGN PATENT DOCUMENTS

| | | |
|---|---|---|
| JP | 2008-072470 A | 3/2008 |
| JP | 4065979 B1 | 3/2008 |
| JP | 2008-312170 A | 12/2008 |

* cited by examiner

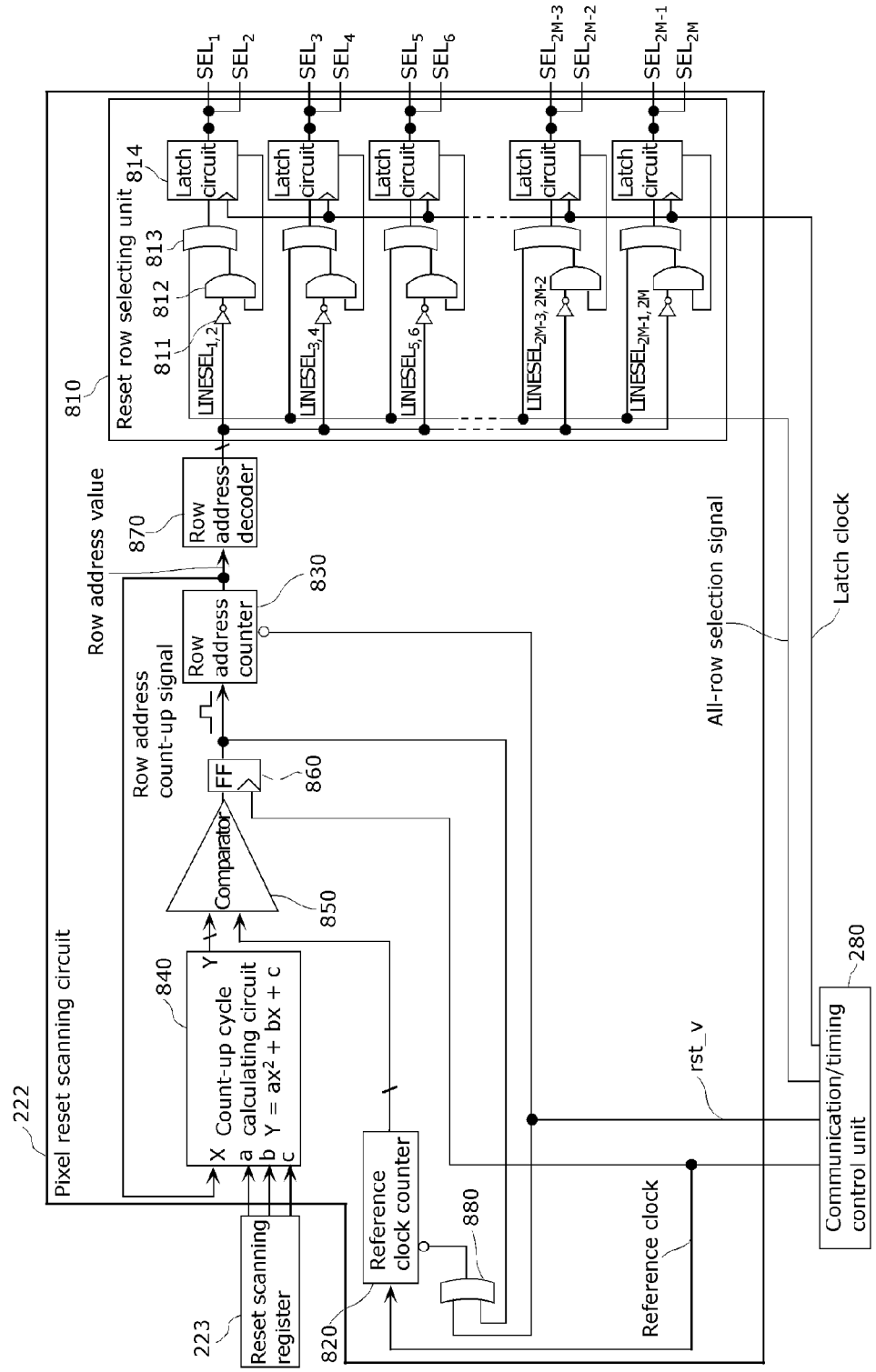

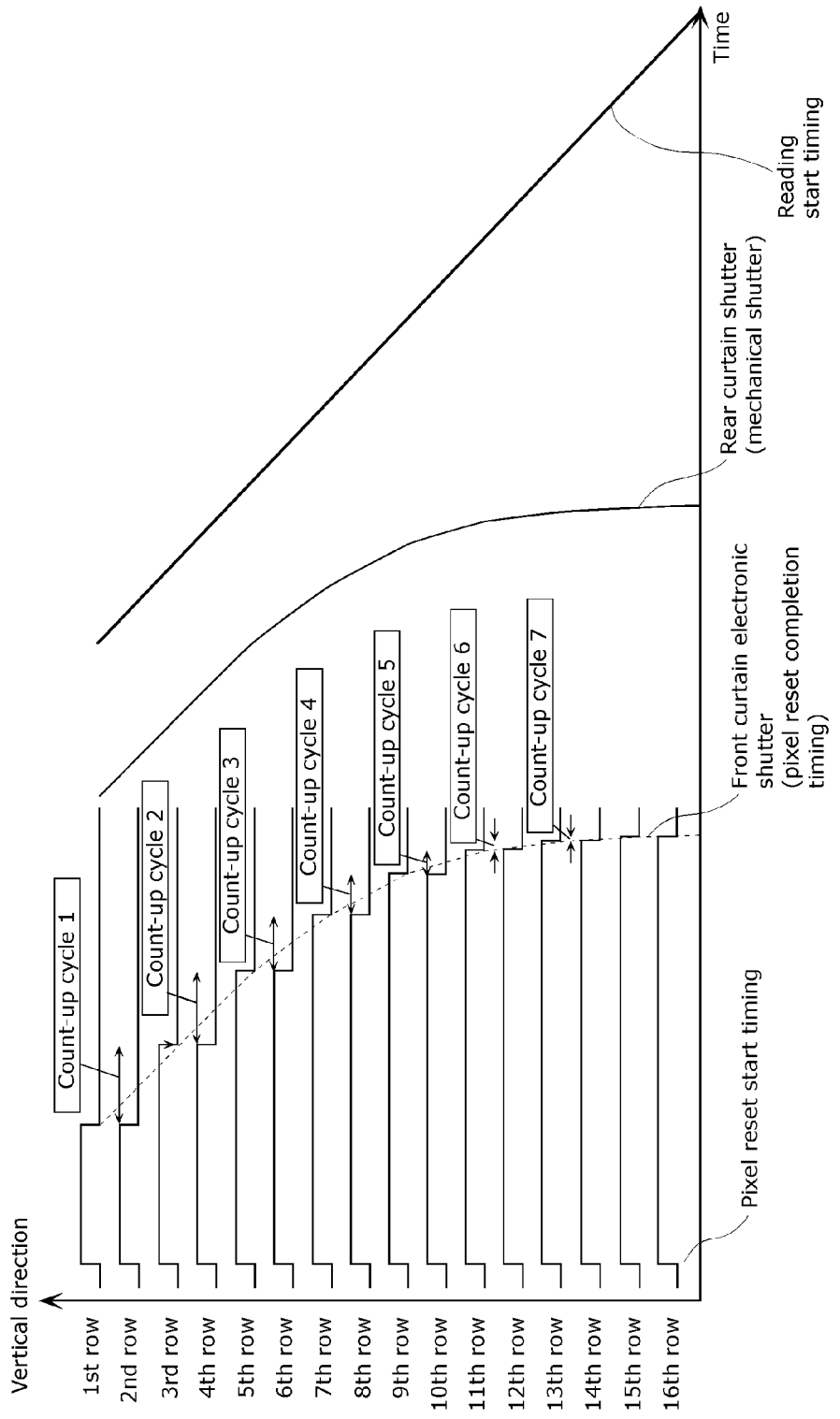

FIG. 11A

| Count-up cycle calculating equation | Row address counter value | $Y = ax^2 + bx + c$ |
|---|---|---|
| Count-up cycle 1 | 0 | 150 cycles |
| Count-up cycle 2 | 1 | 142 cycles |
| Count-up cycle 3 | 2 | 128 cycles |
| Count-up cycle 4 | 3 | 108 cycles |
| Count-up cycle 5 | 4 | 82 cycles |
| Count-up cycle 6 | 5 | 50 cycles |
| Count-up cycle 7 | 6 | 12 cycles |

FIG. 11B

| Reset scanning register | |
|---|---|
| Count-up cycle calculation coefficient register | a = -3 |
| | b = -5 |
| | c = 150 |

223

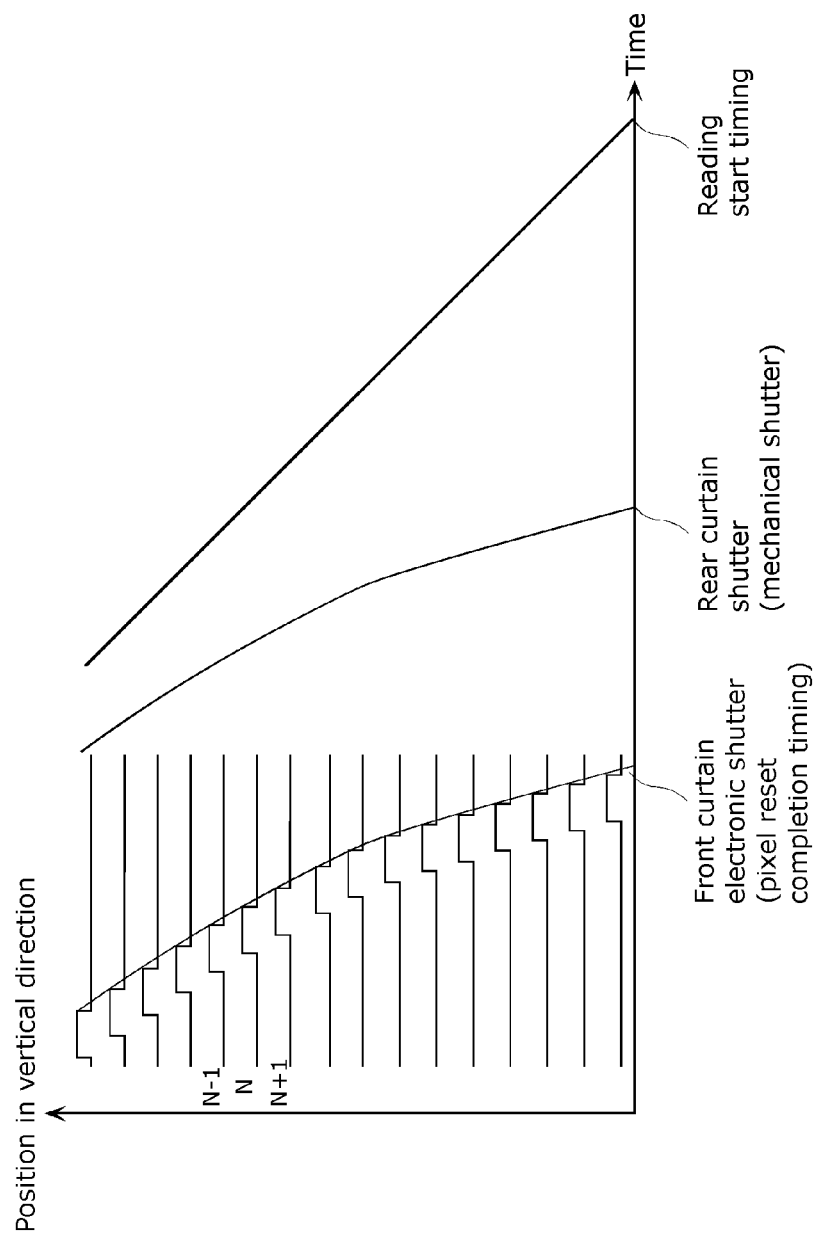

SOLID-STATE IMAGING DEVICE AND IMAGING DEVICE

CROSS REFERENCE TO RELATED APPLICATION

This is a continuation application of PCT International Application No. PCT/JP2011/004098 filed on Jul. 20, 2011, designating the United States of America, which is based on and claims priority of Japanese Patent Application No. 2010-165247 filed on Jul. 22, 2010. The entire disclosures of the above-identified applications, including the specifications, drawings and claims are incorporated herein by reference in their entirety.

FIELD

The present invention relates to solid-state imaging devices and imaging devices which include the solid-state imaging devices, and particularly to a solid-state imaging device which includes unit cells each including a plurality of pixels as one unit, and an imaging device. Specifically, the present invention relates to a solid-state imaging device having an n-pixel one-cell configuration (n is a natural number greater than or equal to 2), and an imaging device.

BACKGROUND

In recent years, digital still cameras including metal oxide semiconductor (MOS)-type solid-state imaging devices are improving rapidly. Curtain shutters are one of the features of single-lens reflex cameras, and focal-plane shutters are generally used for these curtain shutters. A focal-plane shutter needs to be equipped with both of a front curtain mechanical shutter and a rear curtain mechanical shutter. The front curtain mechanical shutter is for determining timing to start exposure, while the rear curtain mechanical shutter is for determining timing to end exposure. This increases size and weight of a camera.

In contrast, in the conventional technique disclosed in Patent Literature (PTL) 1, a front curtain shutter for determining timing to start exposure of a solid-state imaging device is not used. The conventional solid-state imaging device disclosed in PTL 1 has a front curtain electronic shutter function which replaces the front curtain shutter by controlling timing of pixel reset scanning. The pixel reset scanning is an operation to reset a plurality of pixels arranged in an imaging region of the solid-state imaging device.

CITATION LIST

Patent Literature

[PTL1] Japanese Unexamined Patent Application Publication No. 2008-312170

SUMMARY

Technical Problem

However, the above conventional technique has the following problem.

In the conventional technique disclosed in PTL 1, in the pixel reset scanning of the solid-state imaging device, during the resetting of pixels for a row, scanning for sequentially advancing the resetting of pixels of the next row is performed as shown in FIG. 16. With this, a front curtain electronic shutter that operates in accordance with the running time of a rear curtain mechanical shutter is achieved.

Meanwhile, recent trends demand increase in the number of pixels. Therefore, by simply introducing a scaled process, a photodiode area per pixel is decreased. Therefore, a pixel cell configuration is required in which a photodiode area is secured by decreasing the number of transistors per pixel by sharing a reset transistor and a floating diffusion with a plurality of photodiodes and a plurality of transfer transistors. Even manufacturers of large solid-state imaging devices for use in single-lens reflex cameras or the like cannot avoid this trend. Hereinafter, a configuration in which n photodiodes and n transfer transistors share one reset transistor and one floating diffusion is denoted as an n-pixel one-cell configuration.

Here, when the conventional technique disclosed in PTL 1 is applied to the solid-state imaging device having the n-pixel one-cell configuration, a reset-state difference is caused between each of the rows, since the reset transistor and the floating diffusion are shared with an adjacent pixel row. This causes after images and horizontal lines, which lead to deterioration in image quality.

A case is described with taking a unit cell as an example. In the unit cell, two photodiodes and two transfer transistors, which belong to an N-th row and an N+1-th row (N is an arbitrary odd number) share one reset transistor and one floating diffusion. When resetting of the N-th row is completed, the two transfer transistors are ON. Meanwhile, when resetting of the N+1-th row is completed, only one of the transfer transistors is ON. Therefore, a gap is caused between the reset state of the N-th row and the reset state of the N+1-th row, which causes after images and horizontal lines. As a result, the image quality is deteriorated.

The present invention has been conceived in view of the above problems, and has an object to provide a solid-state imaging device having an n-pixel one-cell configuration and an imaging device by which deterioration in image quality is reduced, in a mechanical curtain shutter synchronous mode in which a front curtain electronic shutter and a rear curtain mechanical shutter are used.

Solution to Problem

In order to solve the above problem, a solid-state imaging device according to an aspect of the present invention includes: a plurality of pixels arranged in rows and columns in an imaging region; a plurality of unit cells each including n pixels from among the pixels as one unit arranged in rows and columns in the imaging region, n being a natural number greater than or equal to 2; and a row scanning unit configured to perform pixel reset scanning by scanning the pixels in the imaging region on a row basis, wherein each of the unit cells includes: the n pixels each including a photodiode which converts incident light into electric charges and a transfer transistor which transfers the electric charges converted by the photodiode; a floating diffusion shared by the n pixels and holds the electric charges transferred by the transfer transistors; and a reset transistor shared by the n pixels and resets a potential of the floating diffusion, the pixel reset scanning is processing in which a pixel reset operation is performed on a row basis, the pixel reset operation being processing in which one of the transfer transistors and the reset transistor are turned ON to reset the photodiode corresponding to the one of the transfer transistors, and the row scanning unit is configured to complete the pixel reset operation simultaneously for the n pixels included in the unit cell when performing the pixel reset scanning in a curtain shutter synchronous mode in which exposure of the imaging region to the incident light is started by the pixel reset scanning and ended by blocking the incident light by a mechanical curtain shutter provided on an optical path of the incident light.

With this, in the mechanical curtain shutter synchronous mode, reset operation on all of the pixels included in the unit cell is completed simultaneously, whereby reset-state difference between each of the rows can be prevented and deterioration in image quality can be prevented.

Furthermore, in the curtain shutter synchronous mode, the row scanning unit may determine timing to complete the pixel reset operation, according to running quality of the mechanical curtain shutter.

With this, an appropriate operation as a front curtain electronic shutter can be performed, since the timing to complete the pixel reset operation is determined according to the running quality of the mechanical curtain shutter.

Furthermore, the solid-state imaging device may further include a reset scanning register for holding a parameter which is for determining the timing to complete the pixel reset operation on each of the rows and is determined according to the running quality of the mechanical curtain shutter, wherein, in the curtain shutter synchronous mode, the row scanning unit may perform the pixel reset scanning based on the parameter held by the reset scanning register.

With this, the front curtain electronic shutter that operates to suit the running quality of the mechanical curtain shutter can be easily achieved by merely changing the parameter held by the register.

For example, the row scanning unit may further include: a calculating circuit which calculates the timing to complete the pixel reset operation, using a row address value indicating a row to which the unit cell belongs and the parameter held by the reset scanning register; and a row selection circuit which outputs a row scanning signal to the n pixels included in the unit cell so that the pixel reset operation on the n pixels included in the unit cell is completed at the timing calculated by the calculating circuit.

Furthermore, in the curtain shutter synchronous mode, the row scanning unit may make a period from start to completion of the pixel reset operation on the unit cell constant for all of the pixels included in the imaging region.

With this, it is possible to reduce state difference such as after images caused by the length of a reset period, by making the period of the pixel reset operation constant in the entire imaging region.

Furthermore, in the curtain shutter synchronous mode, the row scanning unit may simultaneously start the pixel reset operation on all of the pixels included in the imaging region.

With this, by starting the pixel reset operation simultaneously, it is possible to control starting easily.

Furthermore, in the curtain shutter synchronous mode, the row scanning unit may perform part of the pixel reset operation in parallel on the pixels included in the unit cell.

With this, by performing part of the pixel reset operation in parallel, a sufficient reset period can be secured and after images can be reduced.

Furthermore, the imaging device according to an aspect of the present invention includes: the above solid-state imaging device; and the mechanical curtain shutter.

With this, in the mechanical curtain shutter synchronous mode, reset operation on all of the pixels included in the unit cell is completed simultaneously, whereby reset-state difference between each of the rows can be prevented and deterioration in image quality can be prevented.

Advantageous Effects

With the present invention, in a solid-state imaging device having an n-pixel one-cell configuration, deterioration in image quality can be reduced in a mechanical curtain shutter synchronous mode in which a front curtain electronic shutter and a rear curtain mechanical shutter are used.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 9 shows a configuration example of a pixel reset scanning circuit according to reset scanning in the embodiment of the present invention.

FIG. 10 shows an example of the reset scanning timing in the embodiment of the present invention.

FIG. 11A shows a calculation example of a count-up cycle in the embodiment of the present invention.

FIG. 11B shows an example of the reset scanning register according to the embodiment of the present invention.

FIG. 16 shows the reset scanning timing in the conventional technique.

DESCRIPTION OF EMBODIMENT

The following describes a solid-state imaging device and an imaging device according to an embodiment of the present invention with reference to the drawings. It is to be noted that the embodiment described below shows a preferable specific example of the present invention. Numeric values, constituents, positions and topologies of the constituents, steps, an order of the steps, and the like in the following embodiment are an example of the present invention, and it should therefore not be construed that the present invention is limited to the embodiment. The present invention is determined only by the statement in Claims. Accordingly, out of the constituents in the following embodiment, the constituents not stated in the independent claims describing the broadest concept of the present invention are not necessary for achieving the object of the present invention and are described as constituents in a more preferable embodiment.

A solid-state imaging device according to the embodiment of the present invention includes a plurality of unit cells each including n pixels as one unit (n is a natural number greater than or equal to 2). The solid-state imaging device including: an imaging region in which the unit cells are arranged in rows and columns; and a row scanning unit configured to scan the n pixels in the imaging region on a row basis. The row scanning unit completes pixel reset operation simultaneously for all of the pixels included in the unit cell when performing pixel reset scanning in a curtain shutter synchronous mode. The pixel reset operation is processing in which a photodiode corresponding to one of transfer transistors is reset. The curtain shutter synchronous mode is a mode in which exposure of the imaging region to the incident light is started by the pixel reset scanning and ended by blocking the incident light by a mechanical curtain shutter provided on an optical path of the incident light.

Furthermore, the imaging device according to the embodiment of the present invention includes: the above solid-state imaging device; and the mechanical curtain shutter. First, description is provided on a configuration of the imaging device according to the embodiment of the present invention, with reference to FIG. 1.

Figure 1:
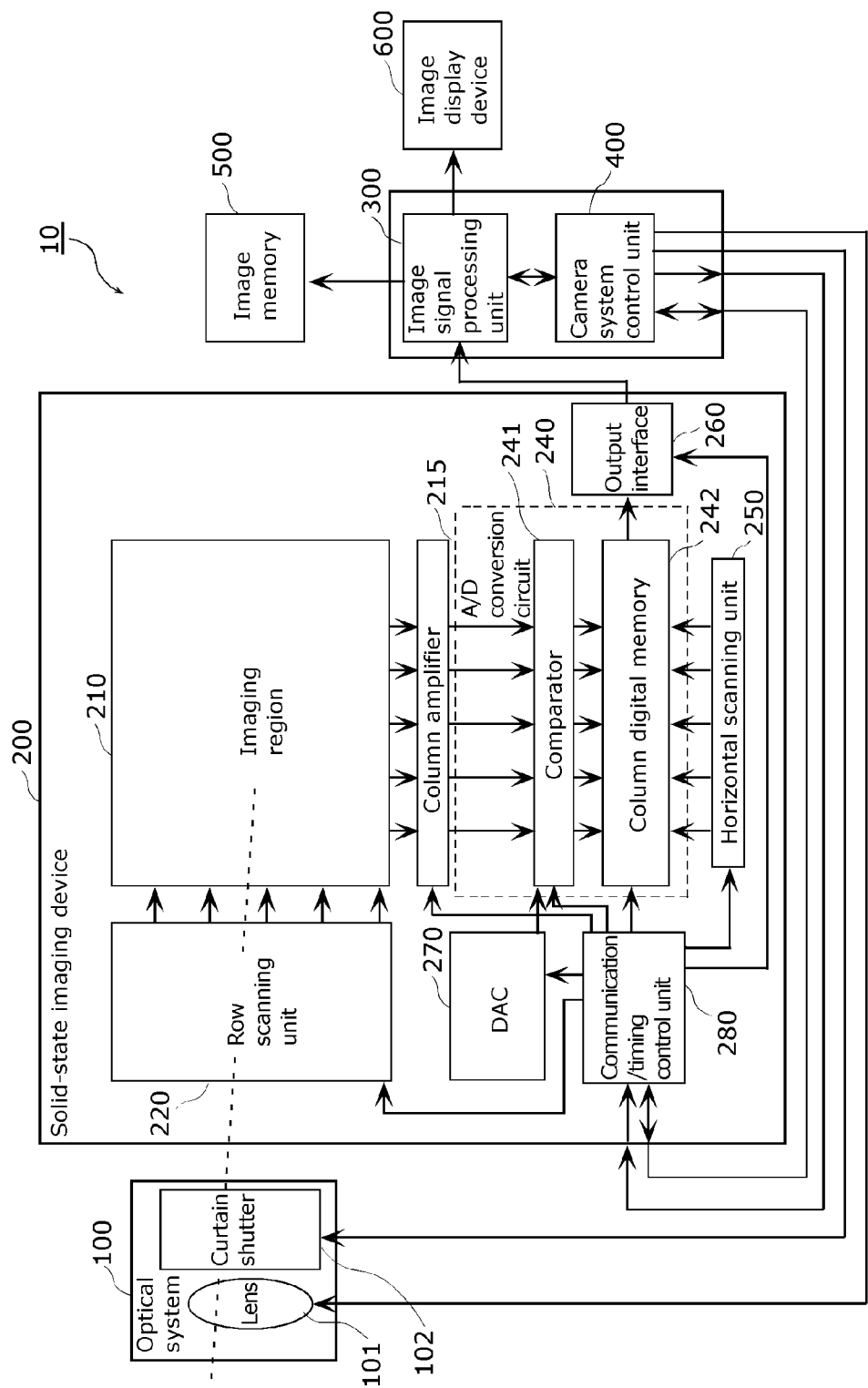
FIG. 1 shows a system configuration example of an imaging device according to an embodiment of the present invention.

FIG. 1 shows an example of a configuration of an imaging device (camera) according to the embodiment of the present invention.

As shown in FIG. 1, an imaging device 10 according to the embodiment of the present invention includes an optical system 100, a solid-state imaging device 200, an image signal processing unit 300, and a camera system control unit 400. Furthermore, the imaging device 10 is connected to and can exchange data with an image memory 500 and an image display device 600.

The optical system 100 includes a lens 101 and a curtain shutter 102.

The lens 101 collects light from an object and forms an image on an imaging region 210 of the solid-state imaging device 200. The curtain shutter 102 is positioned on an optical path between the lens 101 and the solid-state imaging device 200, and is a mechanical shutter which controls an amount of light guided onto the imaging region 210.

The solid-state imaging device 200 includes an imaging region 210, a column amplifier 215, a row scanning unit 220, an A/D conversion circuit 240, a horizontal scanning unit 250, an output interface circuit 260, a DAC circuit 270, and a communication/timing control unit 280.

The imaging region 210 is a region in which a plurality of pixels are arranged in rows and columns and a plurality of unit cells each including n pixels from among the pixels as one unit are arranged in rows and columns. The imaging region 210 converts light passes through the optical system 100 into an electric signal. The unit cell includes pixels each belongs to a different row as one unit, and includes, for example, photoresponsive device such as a photodiode, a MOS transistor, and the like. A detailed configuration of the imaging region 210 is described later.

The row scanning unit 220 performs pixel reset scanning by scanning the pixels in the imaging region 210 on a row basis. Specifically, the row scanning unit 220 selects pixels included in the imaging region 210 on a row basis, and controls the resetting of the pixels and reading of the pixels.

Pixel reset scanning is processing in which a pixel reset operation is performed on a row basis. The pixel reset operation is processing in which the photodiode included in the pixel is reset. Detailed processing is described later.

The column amplifier 215 amplifies the pixel signal read from the imaging region 210.

The A/D conversion circuit 240 A/D converts the pixel signal outputted from the column amplifier 215. The A/D conversion circuit 240 includes a comparator 241 and a column digital memory 242, as shown in FIG. 1.

The comparator 241 compares a reference signal outputted from the DAC circuit 270 and the pixel signal outputted from the column amplifier 215. For example, when a voltage level of a reference signal in a ramp-wave shape reaches at a value greater than or equal to a voltage level of the pixel signal, the comparator 241 outputs a signal.

The column digital memory 242 has counter function. For example, the column digital memory 242 measures a time period taken before the voltage level of the ramp-wave shaped reference signal reaches greater than or equal to the voltage level of the pixel signal, by counting the number of clocks counted after the ramp-wave shaped reference signal is inputted to the comparator 241 before a signal is outputted from the comparator 241. Since the period is proportional to the voltage of the pixel signal, the column digital memory 242 can convert an analog pixel signal into a digital pixel signal.

The column digital memory 242 further includes a memory for holding the pixel signal converted into the digital value. The column digital memory 242 holds the A/D converted pixel signal (digital pixel signal) for each of the columns.

The horizontal scanning unit 250 selects each of the columns held by the column digital memory 242, and drives reading of the held digital pixel signal.

The output interface circuit 260 outputs data held by the column digital memory 242 to outside. Specifically, as shown in FIG. 1, the output interface circuit 260 outputs the digital pixel signal to the image signal processing unit 300.

The DAC circuit 270 generates a reference signal used when A/D conversion is performed, and outputs the generated reference signal to the A/D conversion circuit 240.

The communication/timing control unit 280 (i) controls timing of: the column amplifier 215; the row scanning unit 220; the A/D conversion circuit 240; the horizontal scanning unit 250; the output interface circuit 260; and the DAC circuit 270, of the solid-state imaging device 200 and (ii) controls communication with the image signal processing unit 300 and the camera system control unit 400. For example, the communication/timing control unit 280 supplies a clock signal with each processing unit (processing circuit) of the solid-state imaging device 200.

The image signal processing unit 300 is a digital signal processor (DSP) or the like which receives the digital pixel signal outputted from the solid-state imaging device 200 and performs camera signal processing. The camera signal processing is, for example, processing such as gamma correction, color interpolation processing, spatial interpolation processing, and automatic white balancing. Furthermore, the image signal processing unit 300 may perform: conversion into a compressed format such as joint photographic experts group (JPEG); recording into the memory (image memory 500); and display signal processing for a liquid crystal display (image display device 600) of the camera.

The image memory 500 is, for example, a recording medium detachable to the imaging device 10, such as an SD card. The image display device 600 is a liquid crystal display of the imaging device 10 or a display device connected to the imaging device 10.

The camera system control unit 400 is a microcomputer or the like which integrates an overall operation of the imaging device 10. Specifically, the camera system control unit 400 controls the optical system 100, the solid-state imaging device 200, and the image signal processing unit 300, according to various setting designated through a user interface (not shown). The camera system control unit 400: receives through the user interface, for example, real time instructions such as (i) shutter timing designated by pressing of a release button and (ii) change of zooming magnifications as inputs; changes zooming magnifications of the lens 101; run the curtain shutter 102; and controls the reset scanning of the solid-state imaging device 200.

Particularly, from a viewpoint of the present invention, a designer of the camera system writes a control parameter according to reset scanning adjusted to suit the running quality of the curtain shutter, through the user interface into a reset scanning register described later.

Figure 2:
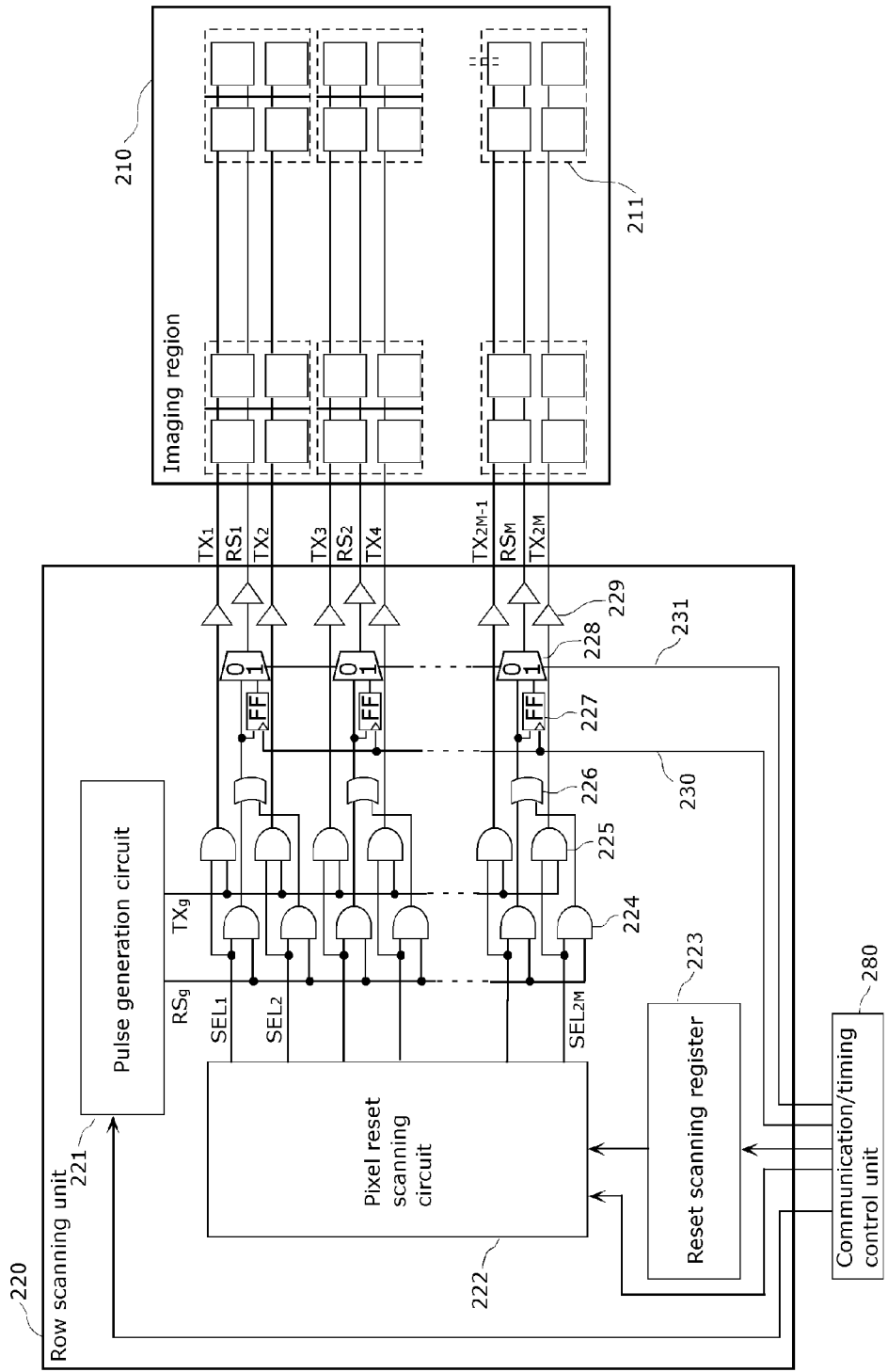
FIG. 2 shows a detailed configuration example of a row scanning unit and an imaging region in the solid-state imaging device according to the embodiment of the present invention.
Figure 3:
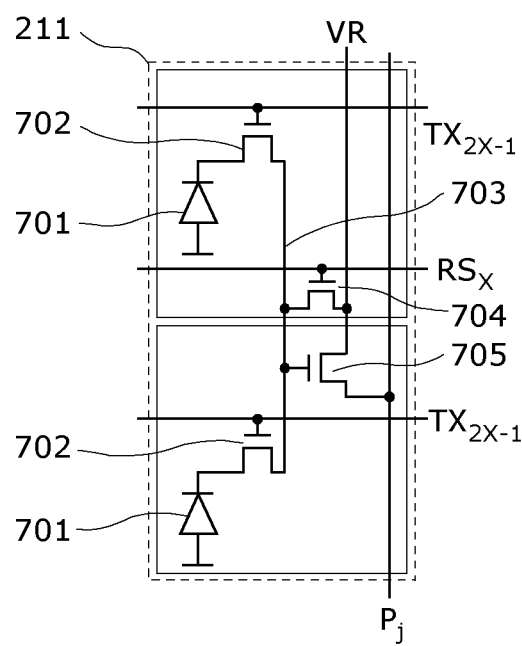
FIG. 3 shows a detailed configuration example of a unit cell in the solid-state imaging device according to the embodiment of the present invention.

Next, description is provided on details of the row scanning unit 220 and the imaging region 210, with reference to FIG. 2 and FIG. 3. FIG. 2 shows a detailed configuration example of the row scanning unit 220 and the imaging region 210 of the solid-state imaging device 200 according to the embodiment of the present invention. FIG. 3 shows a detailed configuration example of the unit cell 211 of the imaging region 210 in the solid-state imaging device 200 according to the embodiment of the present invention. Specifically, a connection between the imaging region 210 and a part of the row scanning unit 220 related to the reset scanning is described. It is to be noted that in this drawing the followings are omitted: a pixel reading scanning circuit included in the row scanning unit 220; and a circuit connected to the pixel reading scanning circuit and related only to pixel reading.

As shown in FIG. 2, in the imaging region 210, unit cells 211 are arranged in rows and columns. Here, each of the unit cells 211 has two pixels per cell. Furthermore, in the example shown in FIG. 2, in the imaging region 210, unit cells 211 of M rows (M is a natural number) are arranged. Accordingly, pixels of 2M rows are arranged. That is, the unit cell 211 in an x-th row includes pixels in a 2x−1-th row and pixels in a 2x-th row ($1 \leq x \leq M$, x is a natural number).

As shown in FIG. 3, a unit cell 211 includes two pixels. Each of the two pixels includes a photodiode 701 and a transfer transistor 702. In other words, the unit cell 211 includes two photodiodes 701 and two transfer transistors 702. Moreover, the unit cell 211 includes one floating diffusion 703, one reset transistor 704, and one source follower (SF) transistor 705. In the unit cell 211, signal electric charges generated by each of the two photodiodes 701 pass the corresponding one of the transfer transistors 702 and are read by the floating diffusion 703.

The photodiode 701 is an example of a photoelectric conversion device, and converts incident light into signal electric charges. That is, the incident light that passes the optical system 100 is converted into signal electric charges according to an amount of light by the photodiode 701.

The transfer transistor 702 is provided corresponding to the photodiode 701, and transfers the electric charges converted by the corresponding photodiode 701 to the floating diffusion 703. A control terminal (gate terminal, for example) of the transfer transistor 702 is connected with a scanning line, and a signal TXi (TX2x−1 or TX2x, in FIG. 3) for controlling ON/OFF of the transfer transistor 702 is inputted.

The floating diffusion 703 holds the electric charges transferred by the transfer transistor 702. As shown in FIG. 3, the floating diffusion 703 is shared by two pixels, namely by two photodiodes 701 and two transfer transistors 702. That is, only one floating diffusion 703 is provided for the unit cell 211.

The reset transistor 704 is a transistor which resets the potential of the floating diffusion 703. A control terminal (gate terminal, for example) of the reset transistor 704 is connected with a scanning line, and a signal RSi (RSx, in FIG. 3) for controlling ON/OFF of the reset transistor 704 is inputted.

It is to be noted that the reset transistor 704 is also shared by two pixels, namely by two photodiodes 701 and two transfer transistors 702. That is, only one reset transistor 704 is provided for the unit cell 211.

The SF transistor 705 amplifies the electric charges held by the floating diffusion 703 and outputs the amplified electric charges to the column amplifier 215 via the column signal line. The SF transistor 705 is also shared by two pixels, namely by two photodiodes 701 and two transfer transistors 702. That is, only one SF transistor 705 is provided for the unit cell 211.

Back in FIG. 2, the row scanning unit 220 includes a pulse generation circuit 221, a pixel reset scanning circuit 222, a reset scanning register 223, a plurality of AND circuits 224 and 225, a plurality of OR circuits 226, a plurality of flip-flop circuits 227, a plurality of selectors 228, and a plurality of buffers 229.

The row scanning unit 220 performs the pixel reset scanning, as described above. The pixel reset scanning is processing in which pixel reset operation is performed on a row basis. The pixel reset operation is processing in which the photodiode 701 included in the pixel is reset. Specifically, the pixel reset scanning is performed by turning ON the transfer transistor 702 and the reset transistor 704.

The pulse generation circuit 221 generates original signals RSg and TXg which are signals common to each of the rows of the imaging region 210. The original signal RSg is an original signal of the signal RSi for controlling ON/OFF of the reset transistor 704 of the unit cell 211. The original signal TXg is an original signal of the signal TXi for controlling ON/OFF of the transfer transistor 702 of the pixel.

The pixel reset scanning circuit 222 performs a selecting scanning for resetting pixels in each of the rows of the imaging region 210. Specifically, the pixel reset scanning circuit 222 outputs a row selection signal SELi to each of the rows. Detailed configuration and operation of the pixel reset scanning circuit 222 is described later.

The reset scanning register 223 is a register which holds a predetermined parameter, and designates a control parameter for the pixel reset scanning circuit 222. Detailed operation of the reset scanning register 223 is described later.

Each of the AND circuits 224 is provided for each of the rows of the pixels arranged in the imaging region 210. The AND circuit calculates AND of the original signal RSg and the row selection signal SELi, and outputs the calculation result to the OR circuit 226.

Each of the AND circuits 225 is provided for each of the rows of the pixels arranged in the imaging region 210. The AND circuit calculates AND of the original signal TXg and the row selection signal SELi, and outputs the calculation result to the buffer 229. It is to be noted that a signal indicating the calculation result of AND of the original signal TXg and the row selection signal SELi is the signal TXi for controlling ON/OFF of the transfer transistor 702.

Each of the OR circuits 226 is provided for each of the unit cells arranged in the imaging region 210. The OR circuit calculates OR of the output signals of the AND circuits 224. The calculation result is outputted to the flip-flop circuit 227 and the selector 228. The OR circuit 226 is provided corresponding to the unit cell 211 (reset transistor 704, specifically). Therefore, when any of the pixels included in the unit cell 211 is selected, the reset transistor 704 is controlled.

The flip-flop circuit 227 delays the output signal from the OR circuit 226 based on a delay clock 230, and outputs the delayed signal to the selector 228.

The selector 228 selects one of (i) the non-delayed signal outputted from the OR circuit 226 and (ii) the delayed signal outputted from the flip-flop circuit 227, based on a curtain shutter valid signal 231. For example, when the curtain shutter valid signal 231 is high level, the selector 228 selects the delayed signal outputted from the flip-flop circuit 227. When the curtain shutter valid signal 231 is low level, the selector 228 selects the signal outputted from the OR circuit 226. The selected signal is outputted to the buffer 229.

The buffer 229 is a waveform shaping buffer provided for each of the scanning lines. It is to be noted that the row scanning unit 220 may include a level shifter for converting signal amplitude, instead of the buffer 229.

As described above, in the two-pixel one-cell configuration, one unit cell 211 is connected with (i) two scanning lines for controlling ON/OFF of two transfer transistors 702 and (ii) one scanning line for controlling ON/OFF of one reset transistor 704.

Figure 4:
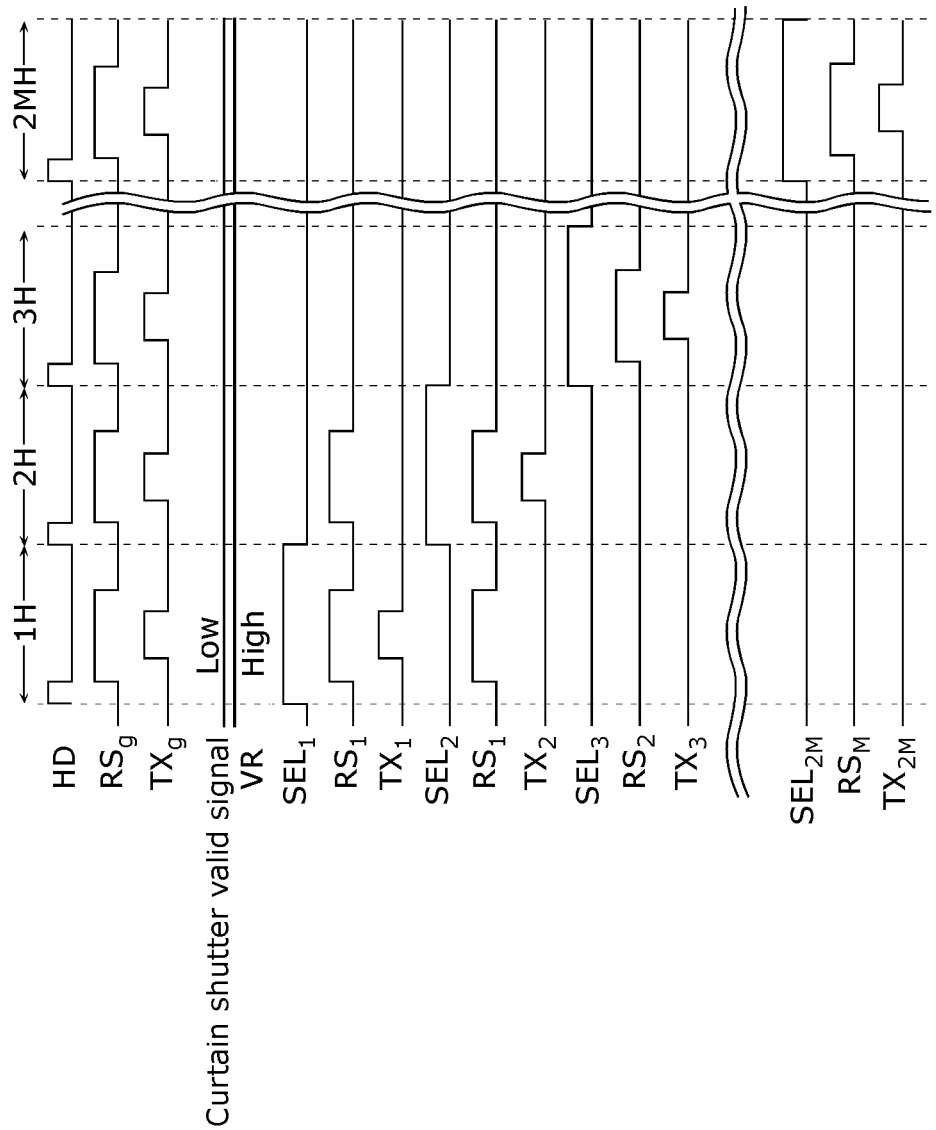
FIG. 4 shows an example of pixel reset scanning timing when both of TXg and RXg are simultaneously turned high level.

Next, description is provided on pixel reset scanning timing for a case when the curtain shutter 102 is not used, with reference to FIG. 4.

When the curtain shutter 102 is not used, the original signals RSg and TXg, which are outputted from the pulse generation circuit 221, become active (high level) once in one horizontal scanning period. One horizontal scanning period (1H, 2H, . . . 2 MH) is determined according to a synchronization pulse of a horizontal synchronizing signal HD inputted externally.

The curtain shutter valid signal 231 becomes high level when the curtain shutter 102 is valid, and becomes low level when the curtain shutter 102 is invalid. In the example shown in FIG. 4, the curtain shutter valid signal 231 is constantly low level since the curtain shutter 102 is not used. Accordingly, the selector 228 constantly selects the non-delayed output signal from the OR circuit 226.

The row selection signal SELi that is sequentially outputted from the pixel reset scanning circuit 222, that is SEL1, SEL2, . . . , is a signal that is basically kept active (high level) during one horizontal scanning period.

The signal TXi becomes high level when the row to which the pixel belongs is selected. Since one row is selected during one horizontal scanning period, the signal TXi becomes high level during one horizontal scanning period from among periods (1H to 2 MH) taken before the entire imaging region 210 is scanned. Specifically, the signal TXi is a signal obtained by (i) calculating AND of the row selection signal SELi and the above-described original signal TXg by the AND circuit 225 and (ii) shaping the waveform by the buffer 229.

The signal RSi becomes high level when the row to which any of the pixels included in the unit cell 211 belongs is selected. Accordingly, the signal RSi becomes high level in a plurality of horizontal scanning periods. Since the two-pixel one-cell configuration is adopted in the present embodiment, RSi becomes high level in two horizontal scanning periods.

Specifically, the signal RSi is generated in the following manner.

First, the AND circuit 224 calculates AND of the row selection signal SELi and the original signal RSg. The OR circuit 226 further calculates OR for the signals indicating the calculation result of AND circuits 224. The signal indicating the calculation result of OR circuit is delayed by the flip-flop circuit 227. Then, the selector 228 selects one of the delayed signal (output signal of the flip-flop circuit 227) and the non-delayed signal (output signal of the OR circuit 226), based on the curtain shutter valid signal 231. The selected signal is waveform shaped by the buffer 229 and outputted as the signal RSi.

In the example shown in FIG. 4, the curtain shutter valid signal 231 is controlled to be constantly low level since the curtain shutter 102 is not used. Therefore, the selector 228 selects the non-delayed signal (output signal of the OR circuit 226).

Here, as shown in FIG. 4, a period is set in which the signals RSi and TXi become high level simultaneously in order to activate resetting on the pixel. However, as shown in FIG. 5, the pixels can also be reset by delaying one of the timing of the TXg and the timing of the RSg and generating a pulse of the TXi and a pulse of the RSi in this order.

Figure 5:
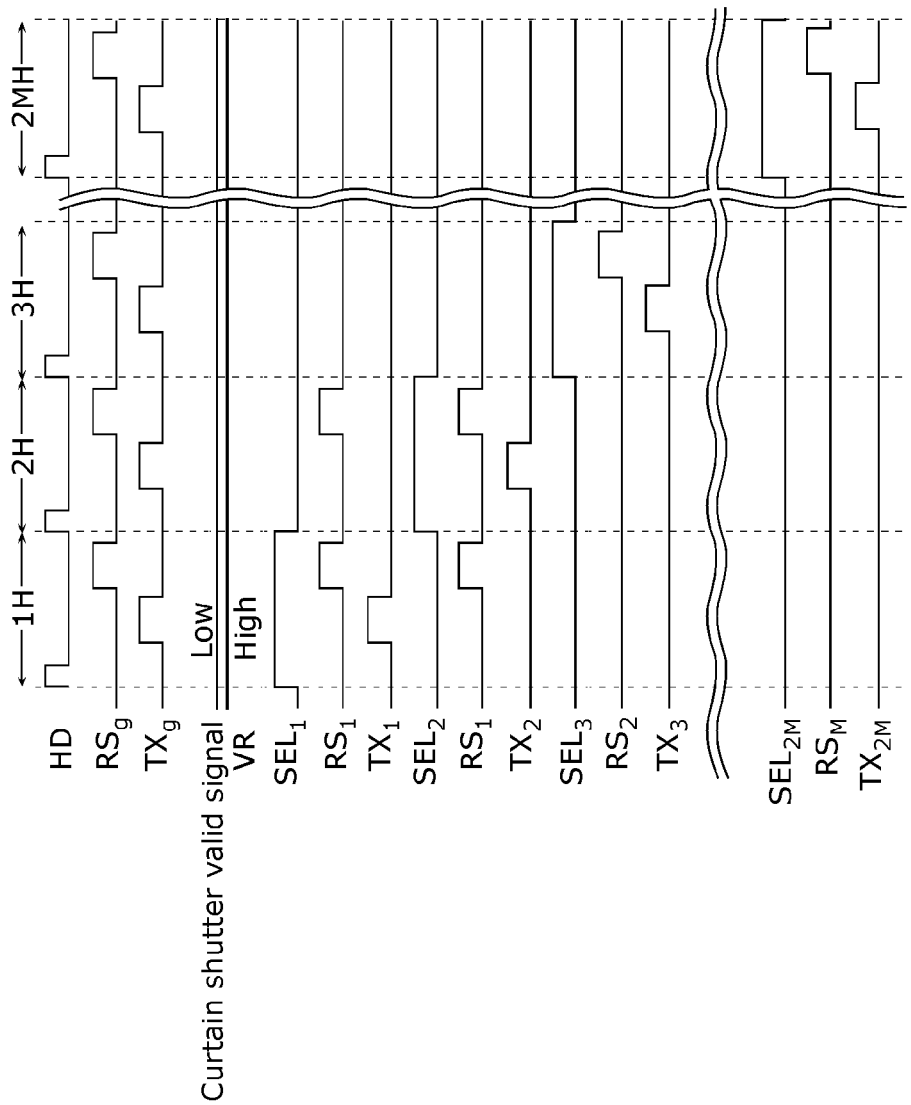
FIG. 5 shows an example of pixel reset scanning timing when timing of TXg and timing of RXg are different.

Here, in this specification, a mode in which the pixel reset scanning of only one row is performed in one horizontal scanning period, which is described with reference to FIGS. 4 and 5, is referred to as a "native mode". In contrast, a mode in which timing of pixel reset scanning and timing of scanning on the curtain shutter 102 are synchronized in order to use the curtain shutter 102 is referred to as a "curtain shutter synchronous mode".

The curtain shutter synchronous mode is a mode in which exposure of the imaging region 210 to the incident light is started by the pixel reset scanning performed by the row scanning unit 220 and ended by blocking the incident light by a mechanical curtain shutter (curtain shutter 102) provided on an optical path of the incident light. In the present embodiment, the row scanning unit 220 completes the pixel reset operation simultaneously for the two pixels included in the unit cell 211 when performing the pixel reset scanning in the curtain shutter synchronous mode. At this time, the row scanning unit 220 determines timing to complete the pixel reset operation, according to running quality of the curtain shutter 102.

Figure 6:
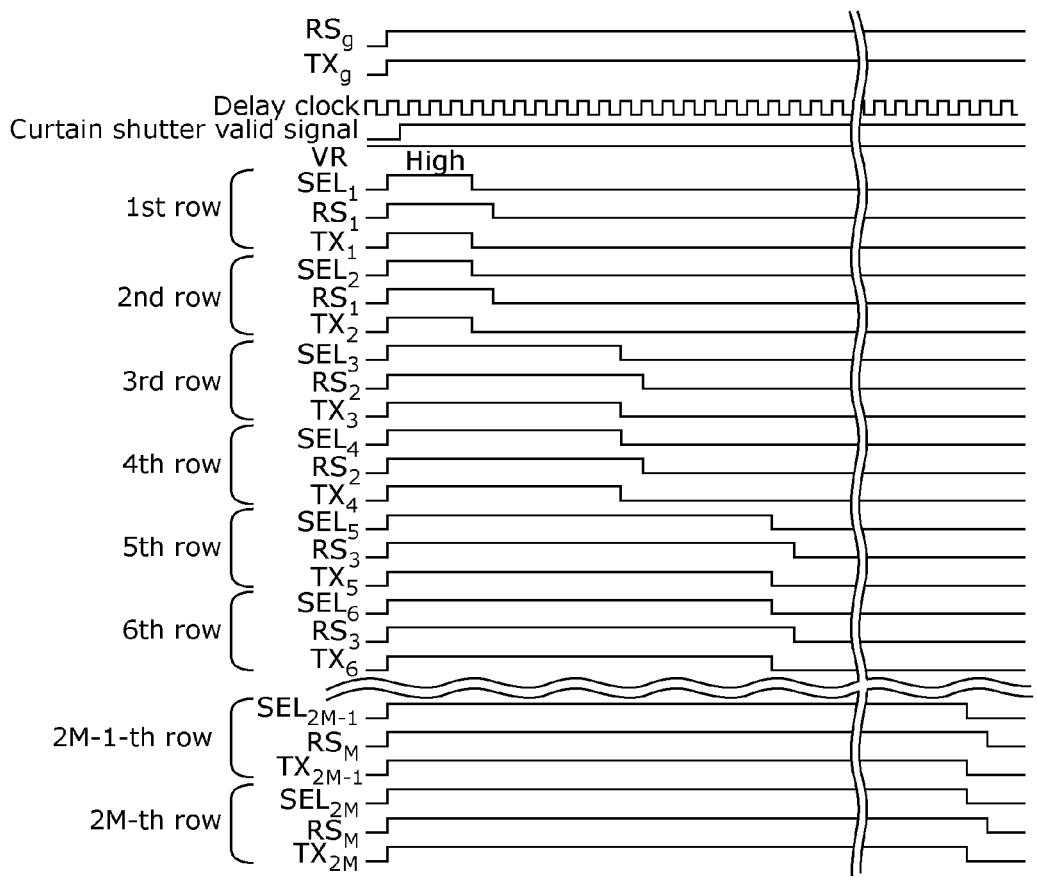
FIG. 6 shows the pixel reset scanning timing in a curtain shutter synchronous mode in the embodiment of the present invention.

Next, description is provided on timing for pixel reset scanning in the curtain shutter synchronous mode, with reference to FIG. 6.

In the curtain shutter synchronous mode, the original signals RSg and TXg outputted from the pulse generation circuit 221 are fixed at high level regardless of the synchronization pulse of the horizontal synchronizing signal HD inputted externally.

All of the row selection signals SELi are first set to high level. A logic circuit unit of the row scanning unit 220 performs logical operation of (i) the row selection signal SELi and the original signal RSg and (ii) the row selection signal SELi and the original signal TXg, and the calculation result is simultaneously outputted to all of the rows as the signals RSi and TXi. At this time, the curtain shutter valid signal 231 is controlled to low level. Therefore, the non-delayed signal (output signal from the OR circuit 226) is selected for the signal RSi.

It is to be noted that the logic circuit unit of the row scanning unit 220 is, specifically, a circuit including the AND circuits 224 and 225, the OR circuit 226, the flip-flop circuit 227, the selector 228, and the buffer 229 shown in FIG. 2. The configuration of the logic circuit unit is not limited to the configuration shown in FIG. 2.

Next, the curtain shutter valid signal 231 is set to high level. Accordingly, the signal RSi is a signal obtained by: calculating AND of the row selection signal SELi and the original signal RSg; calculating OR of the calculation results; and delaying the calculation result by the flip-flop circuit 227.

Next, out of the row selection signals SELi, SEL1 and SEL2 are simultaneously set to low level. Thus, TX1 and TX2 simultaneously become low level, and then RS1 becomes low level after one delay-clock cycle. With this process, the reset operation on the first row and the second row is completed.

Here, the reset operation on the first row and the second row is completed simultaneously because the pixel configuration of the imaging region 210 is the two-pixel one-cell configuration in which the floating diffusion 703 is shared by the first row and the second row. By simultaneously resetting the pixels which share the floating diffusion 703, after images and horizontal lines caused by reset-state difference of the pixels are not caused. Therefore, it is possible to reduce deterioration in image quality.

After the above, control of simultaneously completing the reset operation on the 2x−1-th row and the 2x-th row is repeated until the reset operation on all of the rows is completed.

With taking into consideration the operation on all of the pixel rows included in the imaging region 210 performed by the row scanning unit 220 according to the embodiment of the present invention, it is possible to perform the pixel reset scanning on all of the rows in a way that resetting of all of the pixels included in the unit cell 211 in the n-pixel one-cell configuration can be completed simultaneously. The row scanning unit 220 has function to select a time period taken before completing resetting of each of the rows at arbitrary timing so that the scanning quality of the row scanning unit 220 suits the running quality of the rear curtain shutter.

Figure 7:
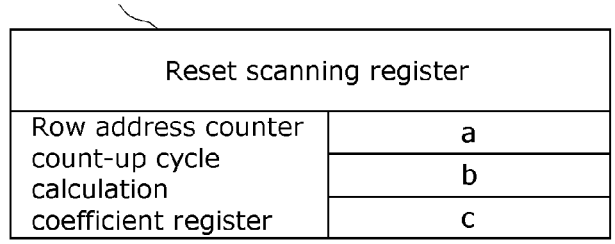
FIG. 7 shows an example of a reset scanning register which sets a parameter according to reset scanning in the embodiment of the present invention.

Here, the configuration of the reset scanning register 223 is described with reference to FIG. 7. FIG. 7 shows an example of a configuration of the reset scanning register 223 according to the embodiment of the present invention.

As shown in FIG. 7, the reset scanning register 223 is a register file and includes as much registers as the number of calculation coefficient based on a count-up calculating equation. Here, three calculation coefficients, namely a, b, and c, are stored in each of the registers.

Figure 8:
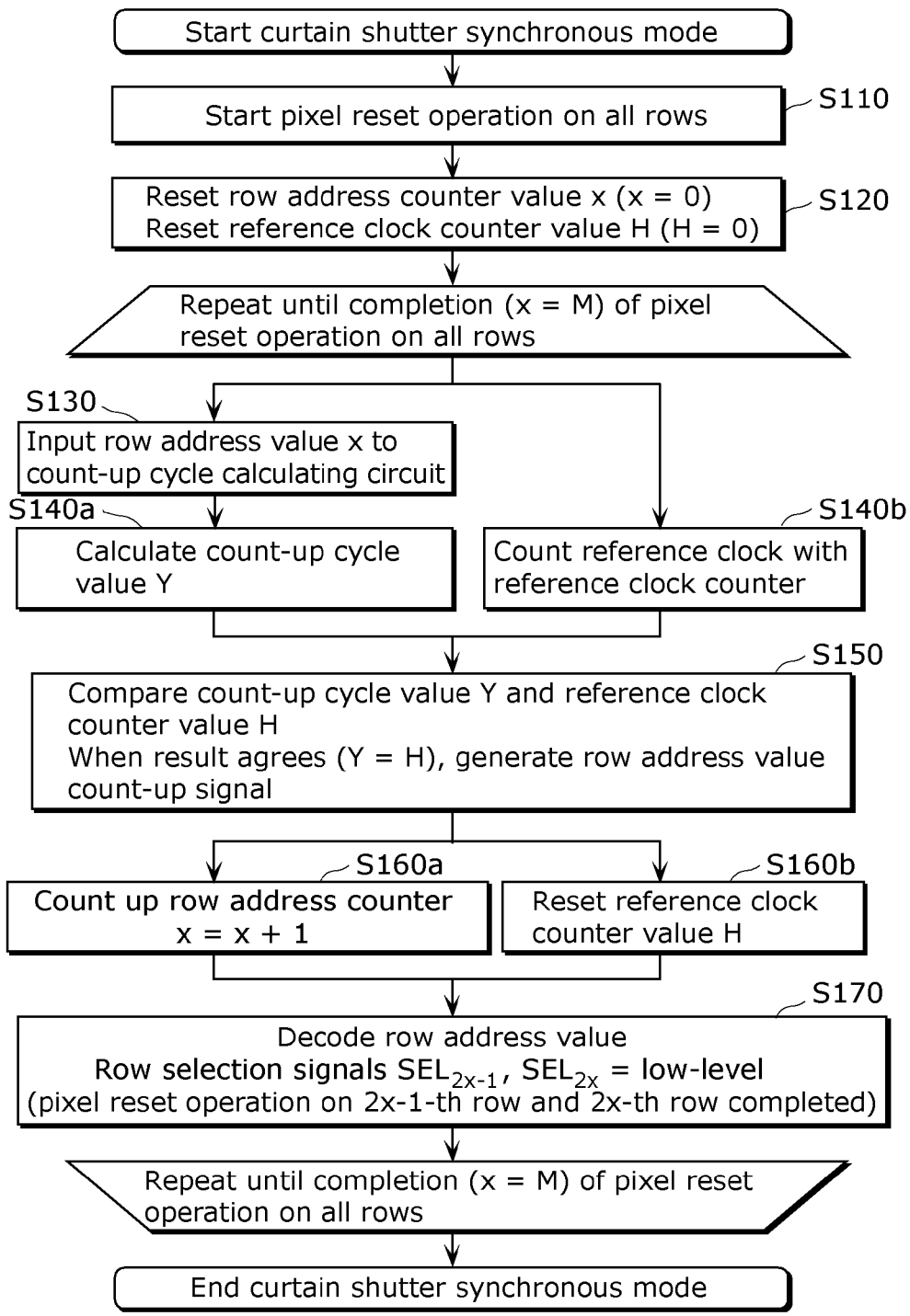
FIG. 8 is a flowchart which shows an example of control of pixel reset scanning in the curtain shutter synchronous mode in the embodiment of the present invention.

The following describes the specific configuration and operation of the pixel reset scanning circuit 222 with reference to FIG. 9 and FIG. 8 that is the flowchart of the curtain shutter synchronous mode.

As shown in FIG. 9, the pixel reset scanning circuit 222 includes a reset row selecting circuit 810, a reference clock counter 820, a row address counter 830, a count-up cycle calculating circuit 840, a comparator 850, a flip-flop circuit 860, a row address decoder 870, and an OR circuit 880.

Furthermore, the reset row selecting unit 810 includes a plurality of NOT circuits 811, a plurality of AND circuits 812, a plurality of OR circuits 813, and a plurality of latch circuits 814. Specifically, the reset row selecting circuit 810 includes the NOT circuit 811, the AND circuit 812, the OR circuit 813, and the latch circuit 814, per two pixel rows.

As shown in FIG. 9, the reset row selecting circuit 810 outputs the same selection signal SEL to the two pixels included in the unit cell 211. In other words, since the signal SEL 2x−1 and the signal 2x are the same, the pixels included in the unit cell 211 can be reset simultaneously.

The following describes the operation of the constituents of the pixel reset scanning circuit 222 shown in FIG. 9, along with the flowchart shown in FIG. 8.

First, when the pixel reset scanning is started, an all-row selection signal is inputted to the reset row selecting circuit 810 from the communication/timing control unit 280. Furthermore, the latch circuit 814 latches the signal according to a latch clock inputted from the communication/timing control unit 280, and all of the row selection signals SELi are set to high level, whereby pixel reset for all of the rows is started (S110). In other words, the row scanning unit 220 simultaneously starts the pixel reset operation on all of the pixels included in the imaging region 210.

Next, a row address value x of the row address counter 830 is reset to 0 by a signal rst_v inputted from the communication/timing control unit 280. It is to be noted that the row address value corresponds to the row number of the row to which the unit cell 211 belongs. Thus, the row address value x outputted from the row address counter 830 to the row address decoder 870 becomes 0, and both of decoded signals LINESEL2x−1 and LINESEL2x inputted to the reset row selecting circuit 810 become low level. In parallel, a reference clock counter value H of the reference clock counter 820 is reset to 0 by the signal rst_v inputted from the communication/timing control unit 280 (S120).

Specifically, the signal rst_v is inputted to the OR circuit 880. The OR circuit 880 calculates OR of the signal rst_v and the output signal from the flip-flop circuit 860, and outputs the calculation result to a reset terminal of the reference clock counter 820. Accordingly, when the signal rst_v is high level, a signal which is high level is outputted from the OR circuit 880. Thus, the reference clock counter value H of the reference clock counter 820 can be reset to 0.

Next, the row address value x is outputted to the count-up cycle calculating circuit 840 from the row address counter 830 (S130).

The count-up cycle calculating circuit 840 sets (i) the row address value inputted from the row address counter 830 as x and (ii) values of a register group outputted by a count-up calculation coefficient register as a, b, and c, and calculates count-up cycles. Specifically, the count-up cycle calculating circuit 840 calculates a count-up cycle value Y using the following count-up cycle calculating equation: $Y=ax^2+bx+c$. The count-up cycle value Y obtained as a result of the calculation is outputted to the comparator 850 (S140a).

In parallel with the above S130 and S140a, a reference clock is inputted from the communication/timing control unit 280 to the reference clock counter 820. The reference clock counter 820 counts up the reference clock, and outputs the reference clock counter value H to the comparator 850 (S140b).

The comparator 850 compares the count-up cycle value Y and the reference clock counter value H. When Y and H match, the output signal of the comparator 850 becomes high level, and the output signal is outputted to the flip-flop circuit 860 (S150).

The output from the flip-flop circuit 860 is inputted to the row address counter 830, and the row address counter 830 counts up the row address value x (S160a). Specifically, x=x+1.

In parallel, the output from the flip-flop circuit 860 is also inputted to the reset terminal of the reference clock counter 820 via the OR circuit 880, and the reference clock counter 820 resets the reference clock counter value H to 0 (S160b).

Next, the row address counter 830 outputs the row address value x to the row address decoder 870. The row address decoder 870 decodes the row address value x, and inputs the decoded signals LINESEL2x−1 and LINESEL2x to the reset row selecting circuit 810.

In the reset row selecting circuit 810, the NOT circuit 811 outputs inversion signals of the decoded signals LINESEL2x−1 and LINESEL2x to the AND circuit 812. In other words, the LINESEL2x−1 and LINESEL2x which are low level are inputted to the AND circuit 812. Accordingly, the AND circuit 812 calculates AND of the low-level signal and the output signal of the latch circuit 814, and the low-level signal is latched by the latch circuit 814.

As a result, the signal SEL2x−1 and the signal SEL2x become low level, and the low-level signals are outputted from the pixel reset scanning circuit 222. By turning of the signal SEL2x−1 and the signal SEL2x to low level, the pixel reset operation on the 2x−1-th row and the 2x-th row is simultaneously completed, as shown in the timing chart in FIG. 6 above (S170).

Processing of S130 to S170 is repeated until the reset operation on all of the rows is completed, that is, until the row address value x=M.

The following describes the above with taking a specific example. First, regarding a first repetition of S130 though S170, in S130, the first row address value x is 0, and therefore X=0 is inputted to the count-up cycle calculating circuit 840. In S140a, the first row address value x is 0, and therefore the count-up cycle value Y=c is outputted to the comparator 850.

In S150, the first count-up cycle value Y=c, and therefore the output signal of the comparator 850 becomes high level when Y=H=c and a high-level signal is inputted to the flip-flop circuit 860.

In S160, the first row address value x is 0, and therefore the row address value x is incremented (+1) and x=1. In S170, the first row address value x is 1, and therefore the pixel reset of the first row and the second row is completed simultaneously.

This is the operation performed by the pixel reset scanning circuit 222 in the first repetition.

Regarding a second repetition of S130 though S170, in S130, the row address value x is 1, and therefore x=1 is inputted to the count-up cycle calculating circuit 840. In S140a, the row address value x is 1, and therefore the count-up cycle value Y=a+b+c is outputted to the comparator 850.

In S150, the count-up cycle value Y=a+b+c, and therefore the output of the comparator 850 becomes high level when Y=H=a+b+c, and a high level signal is inputted to the flip-flop circuit 860.

In S160, the row address value x is 1, and therefore the row address value x is incremented (+1) and x=2. In S170, the first row address value x is 2, and therefore the pixel reset of the third row and the fourth row is completed simultaneously.

Step S130 through S170 is repeated until the row address value x becomes M, that is, until the reset of the M−1-th row and the M-th row is completed simultaneously and the pixel reset of all of the rows is completed.

With the above process, the pixel reset scanning circuit 222 can simultaneously complete the resetting of all of the pixels included in the unit cells 211 in an n-pixel one-cell configuration while performing the pixel reset scanning of all of the rows.

The following describes that it is possible to perform scanning that suits the running quality of the rear curtain shutter in the curtain shutter synchronous mode with the flowchart shown in FIG. 8 and the configuration showing in FIG. 9, with reference to FIGS. 10, 11A, and 11B. It is to be noted that, in FIG. 10, the vertical axis corresponds to a position in the vertical direction (each of the rows of imaging region 210), the horizontal axis corresponds to the time, and the pulse of each of the rows indicates the pixel reset scanning timing. The rear curtain shutter (mechanical shutter that is the curtain shutter 102) and reading start timing are also shown in FIG. 10.

First, as shown in FIG. 10, in the curtain shutter synchronous mode, the row scanning unit 220 simultaneously starts the pixel reset operation on all of the pixels included in the imaging region 210.

Then, as shown in FIGS. 11A and 11B for example, the count-up coefficient register of the reset scanning register 223 are set as a=−3, b=−5, and c=−150, so that a count-up cycle 1, a count-up cycle 2, a count-up cycle 3, a count-up cycle 4, a count-up cycle 5, a count-up cycle 6, and a count-up cycle 7 are set to 150 cycles, 142 cycles, 128 cycles, 108 cycles, 82 cycles, 50 cycles, and 12 cycles, of the reference clock cycle in this order. In this case, 150 cycles after the completion of the reset operation on the first row and the second row, the reset operation on the third row and the fourth row is completed. Then, 142 cycles after the completion of the reset operation on the third row and the fourth row, the reset operation on the fifth row and the sixth row is completed. Then, 128 cycles after the completion of the reset operation on the fifth row and the sixth row, the reset operation on the seventh row and the eighth row is completed. Then, 108 cycles after the completion of the reset operation on the seventh row and the eighth row, the reset operation on the ninth row and the tenth row is completed. Then, 82 cycles after the completion of the reset operation on the ninth row and the tenth row, the reset operation on the eleventh row and the twelfth row is completed. Then, 50 cycles after the completion of the reset operation on the eleventh row and the twelfth row, the reset operation on the thirteenth row and the fourteenth row is completed. Then, 12 cycles after the completion of the reset operation on the thirteenth row and the fourteenth row, the reset operation on the fifteenth row and the sixteenth row is completed.

In this manner, by performing the pixel reset according to the count-up cycle value, it is possible to approximate timing of the front curtain electronic shutter for the pixel reset to the non-linear running quality of the rear curtain shutter. Specifically, by determining the calculation coefficient held by the reset scanning register 223 according to the running quality of the mechanical shutter (curtain shutter 102), it is possible to approximate the timing of front curtain electronic shutter to the running quality. The running quality of the curtain shutter 102 indicates motion of the curtain shutter 102, specifically, the timing to complete exposure of the imaging region 210.

As described above, the solid-state imaging device 200 according to the embodiment of the present invention includes the row scanning unit 220, and the row scanning unit 220 simultaneously completes the pixel reset operation on the pixels included in the unit cell 211 in the mechanical curtain shutter synchronous mode.

With this configuration, it is possible to reduce reset-state difference between all of the pixels in the unit cell 211 and to prevent after images and horizontal lines caused by the reset-state difference, whereby deterioration in image quality is reduced.

Furthermore, the solid-state imaging device 200 according to the embodiment of the present invention includes the count-up cycle calculating circuit 840 and the reset scanning register 223 for the row address counter 830, and performs the pixel reset scanning according to a parameter (calculation coefficient) held by the reset scanning register 223.

With this configuration, it is possible to finely adjust the scanning quality of the pixel reset scanning to the running quality of the mechanical curtain shutter even when the running quality of the mechanical curtain shutter is non-linear or a different type of mechanical curtain shutter is used.

Furthermore, as shown in FIG. 10, in the curtain shutter synchronous mode, the row scanning unit 220 performs part of the pixel reset operation in parallel on the pixels included in the unit cell 211. That is, the row scanning unit 220 performs part of the period from start to completion of the pixel reset operation in parallel on the pixels included in the unit cell.

For example, when the row scanning unit 220 does not perform the pixel reset operation in parallel, sufficient reset period may not be secured depending on the running quality of the mechanical shutter. With this configuration, by performing part of the pixel reset operation in parallel, a sufficient reset period can be secured and after images can be reduced.

As described above, with the solid-state imaging device according to the present invention, in the curtain shutter synchronous mode, the reset operation on all of the pixels in the unit cells is completed simultaneously even with a multi-pixel one-cell configuration in which a plurality of pixels share one reset transistor and one floating diffusion. Therefore, it is possible to prevent after images and horizontal lines caused by reset-state difference. This allows image capturing using a front curtain electronic shutter without deterioration of image quality.

Furthermore, the solid-state imaging device 200 according to the embodiment of the present invention includes the count-up cycle calculating circuit 840 and the reset scanning register 223 for the row address counter 830, and performs the pixel reset scanning according to a parameter (calculation coefficient) held by the reset scanning register 223. Therefore, it is possible to suit scanning quality of starting exposure to running quality of the rear curtain shutter.

The solid-state imaging device, the imaging device, and the driving method according to the present invention have been described above based on the embodiment. However, the present invention is not limited to these embodiments. The scope of the present invention includes other embodiments that are obtained by making various modifications that those skilled in the art could think of, to the present embodiment, or by combining constituents in different embodiments, without deviating from the spirit of the present invention.

For example, in FIGS. 4 and 5, the signal RSi is indicated in a waveform controlled on a row basis, in the same manner as the signal TXi. However, it is possible to set the signal RSi active (high level) for all of the rows in the pixel reset period and control the pixel reset scanning using only the signal TXi.

It is to be noted that VR shown in FIG. 4 through FIG. 6 is a power source of the pixels. VR is shown just in case since voltage control is sometimes performed at reading in the pixel configuration shown in FIG. 2. However, the pixel reset scanning can be performed while maintaining the power source potential and the power source is not related directly to the present invention.

Figure 12:
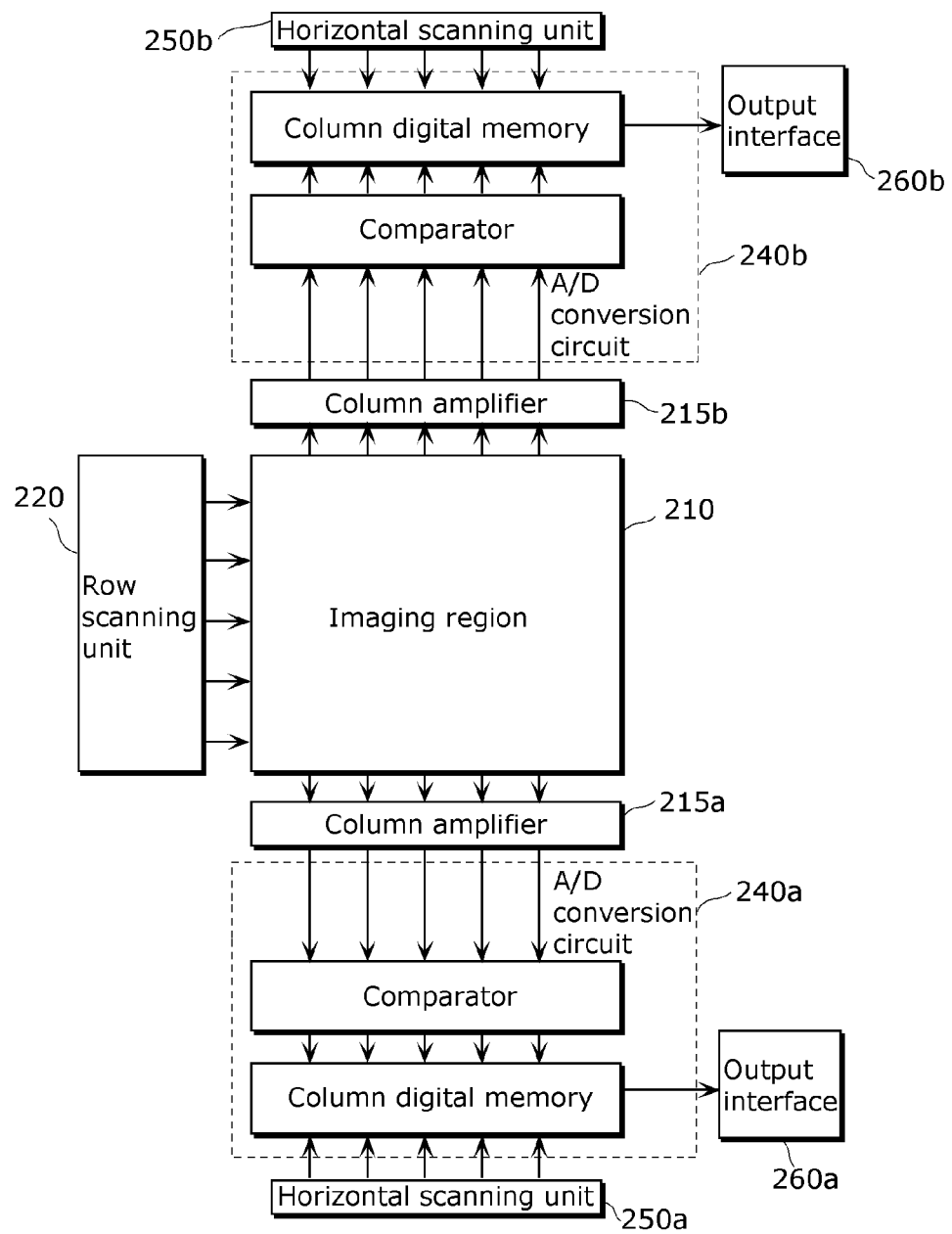
FIG. 12 shows a configuration example of the solid-state imaging device according to a modification of the embodiment of the present invention.

Furthermore, as shown in FIG. 12, the solid-state imaging device 200 according to the present invention includes an imaging region 210, a row scanning unit 220, two column amplifiers 215a and 215b, two A/D conversion circuits 240a and 240b, two horizontal scanning units 250a and 250b, and two output interface circuits 260a and 260b. A configuration may also be applied in which two column signals are outputted from a plurality of directions (two directions, for example).

Figure 13:
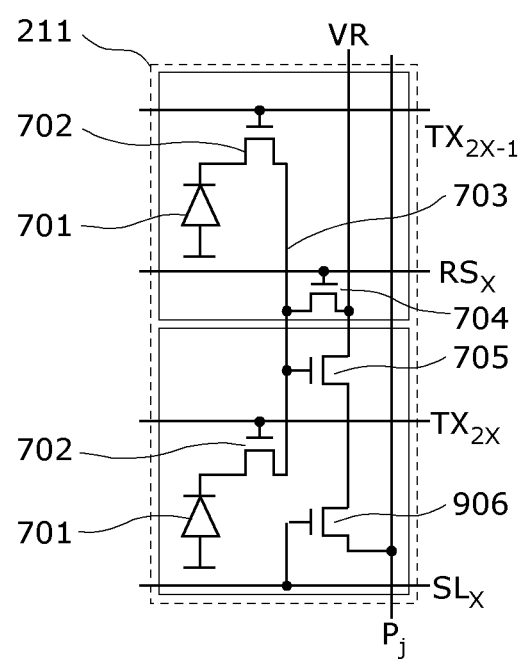
FIG. 13 shows another configuration example of the unit cell according to the modification of the embodiment of the present invention.
Figure 14:
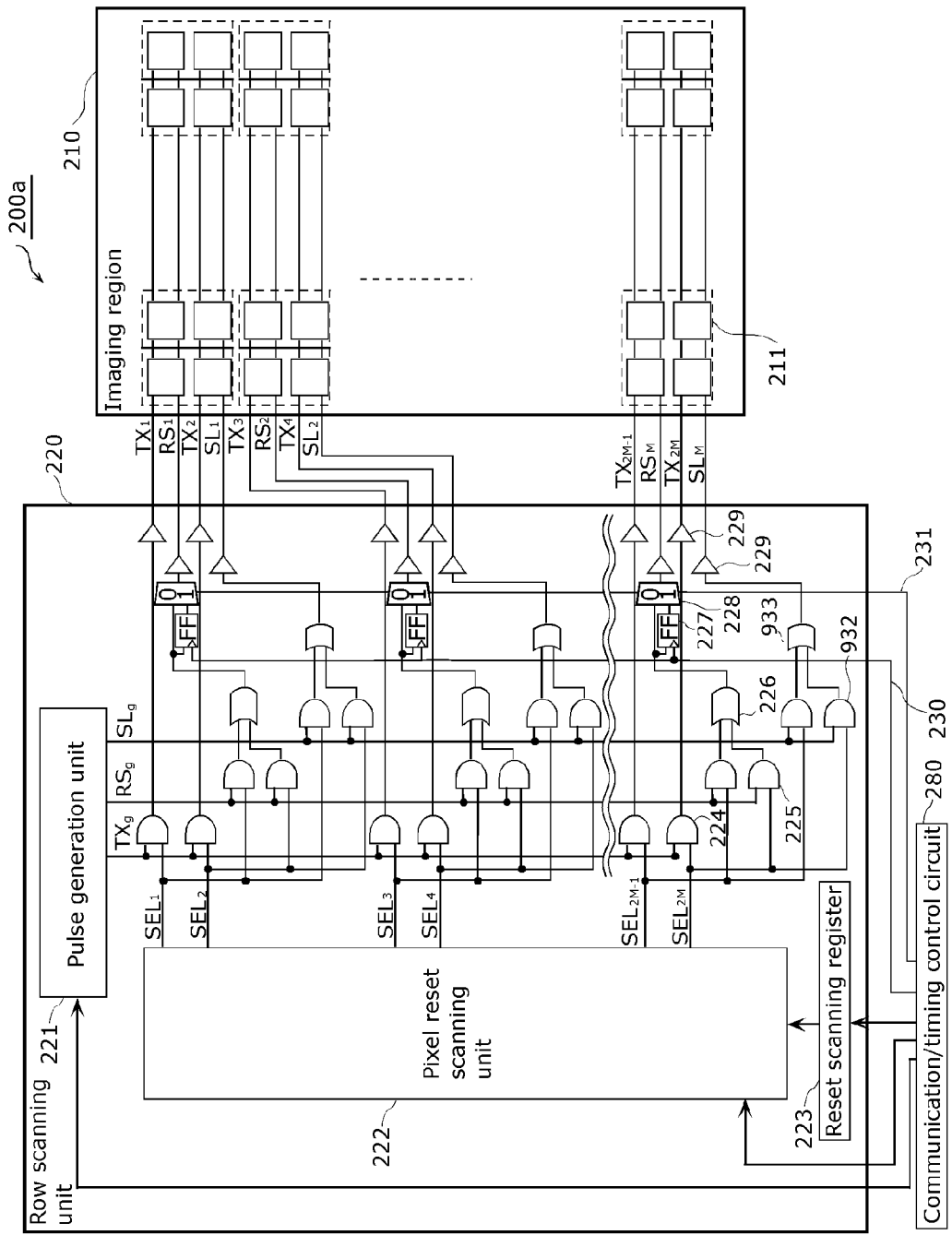
FIG. 14 shows a detailed configuration example of a row scanning unit and an imaging region in the solid-state imaging device according to the modification of the embodiment of the present invention.

It is to be noted that the present invention does not depend on the detailed configuration of pixels and may be applied to any configuration. For example, as shown in FIGS. 13 and 14, a configuration in which a selection transistor 906 is provided in a unit cell can be applied in the present invention. FIG. 13 shows a detailed configuration example of a unit cell in the solid-state imaging device when the selection transistor is provided in the unit cell according to a modification of the embodiment of the present invention.

The unit cell 211 shown in FIG. 13 includes two photodiodes 701, two transfer transistors 702, one floating diffusion 703, one reset transistor 704, one SF transistor 705, and one selection transistor 906. That is, one floating diffusion 703, one reset transistor 704, one SF transistor 705, and one selection transistor 906 are provided for two photodiodes 701 and two transfer transistors 702.

Signal electric charges of the two photodiodes 701 pass a corresponding one of the transfer transistors 702 and the signal electric charges are transferred to the floating diffusion 703. Then, after the signal electric charges are amplified by the SF transistor 705, the signal electric charges are read through the selection transistor 906.

FIG. 14 shows a detailed configuration example of the solid-state imaging device 200 when the selection transistor 906 is provided in the unit cell 211. Specifically, a connection between the imaging region 210 and a part of the row scanning unit 220 related to the reset scanning is described. It is to be noted that in this drawing the followings are omitted: a pixel reading scanning circuit included in the row scanning unit 220; and a circuit connected to the pixel reading scanning circuit and related only to pixel reading.

As shown in FIG. 14, the row scanning unit 220 further includes a plurality of AND circuits 932, a plurality of OR circuits 933, and a plurality of buffers 229, in addition to the configuration of the row scanning unit 220 shown in FIG. 2. Furthermore, the pulse generation circuit 221 further generates an original signal SLg which is a signal common to each row of the imaging region 210. The original signal SLg is an original signal of a signal SLi for controlling ON/OFF of the selection transistor 906 of the unit cell 211.

Each of the AND circuits 932 is provided for each of the rows of pixels arranged in the imaging region 210. The AND circuit calculates AND of the original signal SLg and the row selection signal SELi, and outputs the calculation result to the OR circuit 933.

Each of the OR circuits 933 is provided for each of the unit cells 211 arranged in the imaging region 210. The OR circuit 933 calculates OR of the output signals of the AND circuits 932. The calculation result is outputted to the selection transistor 906 of the unit cell 211 via the buffer 229. The OR circuit 933 is provided corresponding to the unit cell 211 (specifically, selection transistor 906). Therefore, when any of the pixels included in the unit cell 211 is selected, the selection transistor 906 is controlled.

As described above, even when the configuration of the unit cell 211 is different from the configuration shown in FIG. 3, the present invention can be applied by changing the configuration of the row scanning unit 220.

Furthermore, a structure of so-called backside illumination image sensor (backside illumination solid-state imaging device) may be applied in which pixels are formed above a back surface of a semiconductor substrate, that is above the reverse side from the surface above which the gate terminal and the wiring of the transistor are formed, in addition to the structure in which pixels are formed above a surface of a semiconductor substrate, that is the same surface as the surface above which the gate terminal and the wiring of the transistor are formed.

Furthermore, a configuration including a column amplifier 215 and an A/D conversion circuit 240 is described as a circuit system of a signal output path from pixels. However, the present invention can be applied to a configuration without these constituents.

Furthermore, in the present embodiment, an example is described in which the row scanning unit 220 includes the count-up cycle calculating circuit 840 and the reset scanning register 223 for the row address counter 830. In contrast, other blocks included in the solid-state imaging device 200 may include the count-up cycle calculating circuit 840 and a reset scanning register 223 for the row address counter 830. Furthermore, for example, when an image signal processing unit 300 and a camera system control unit 400 are formed on the same silicon substrate as the solid-state imaging device 200 of the present embodiment, the reset scanning register 223 may be included in the image signal processing unit 300 or the camera system control unit 400.

Furthermore, in the present embodiment, the calculating equation used by the count-up cycle calculating circuit 840 is a quadratic equation $Y=ax^2+bx+c$. In contrast, for example, the count-up cycle calculating circuit 840 may use, as a calculating equation, a k-th equation: $Y=u_1^k+u_2x^{k-1}+u_3x^{k-2}+\ldots+u_kx+u_{k+1}$. In this case, k is selected according to the running quality of the rear curtain shutter. Here, k is a natural number greater than or equal to 1, and $u_i$ is a count-up coefficient register.

Furthermore, in the present embodiment, a case is described in which a count-up cycle value of the row address counter 830 varies as a reset scanning parameter. In contrast, for example, cycle number counted from a start of the curtain shutter synchronous mode to a completion of the pixel reset operation on each of the rows may be used as a parameter, instead of the count-up cycle value of the row address counter 830. Even in this case, the same advantageous effect of the present invention is provided.

Furthermore, in the configuration of the unit cell according to the embodiment of the present invention, a two-pixel one-cell configuration is described. However, a four-pixel one-cell pixel, or a configuration in which further more photodiodes are shared may be applied. Even in such a case, the same advantageous effect is provided and no specific limitation is added. Specifically, although a reading circuit is shared by two pixels in the above, the reading unit may be shared by further more pixels, such as by three pixels or four pixels. Moreover, the reading unit may be shared by pixels over a plurality of columns.

For example, in an n-pixel one-cell configuration, one unit cell is connected with: n-scanning lines for controlling ON/OFF of n transfer transistors; one scanning line for controlling ON/OFF of one reset transistor, from the row scanning unit.

Furthermore, in the curtain shutter synchronous mode, the row scanning unit 220 may make the period taken from the start to the completion of the pixel reset operation on the unit cell 211 constant for all of the pixels in the imaging region 210. That is, the pixel reset operation is started simultaneously in the entire imaging region 210 in the configuration shown in FIG. 10. However, for example, the period taken from the start to the completion of the pixel reset operation may be constant for all of the pixels, by controlling timing to start the pixel reset operation according to the running quality of the rear curtain shutter (mechanical shutter).

With this, it is possible to reduce state difference such as after images caused by the length of a reset period, by making the period of the pixel reset operation constant in the entire imaging region.

Figure 15A:
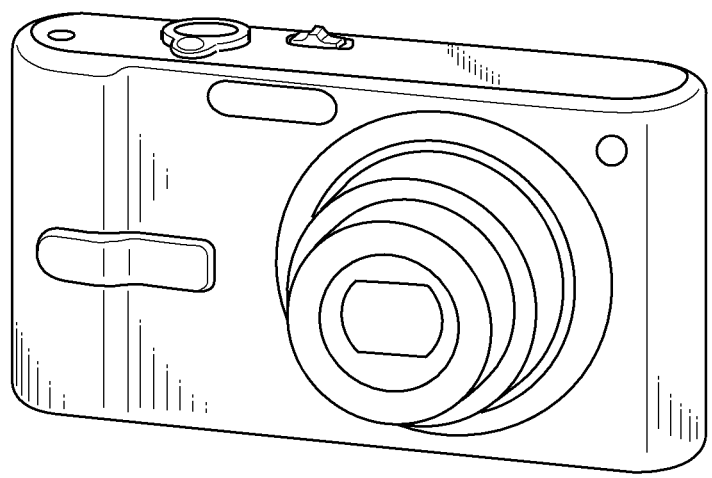
FIG. 15A is an external view of an example of the imaging device according to the embodiment of the present invention.
Figure 15B:
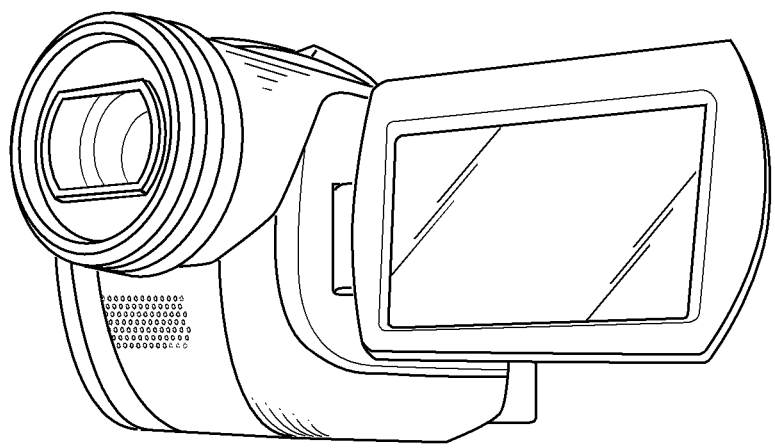
FIG. 15B is an external view of an example of the imaging device according to the embodiment of the present invention.

It is to be noted that the imaging device 10 including the solid-state imaging device 200 according to the present invention is, for example, a digital still camera as shown in FIG. 15A and a digital video camera as shown in FIG. 15B.

Although only an exemplary embodiment of the present invention has been described in detail above, those skilled in the art will readily appreciate that many modifications are possible in the exemplary embodiment without materially departing from the novel teachings and advantages of the present invention. Accordingly, all such modifications are intended to be included within the scope of the present invention.

INDUSTRIAL APPLICABILITY

With the imaging device and the solid-state imaging device according to the present invention, the following advantageous effect is provided in a solid-state imaging device having an n-pixel one-cell configuration: deterioration in image quality is reduced in a mechanical curtain shutter synchronous mode in which a front curtain electronic shutter and a rear curtain mechanical shutter are used. The present invention can be used for single-lens reflex digital still cameras, single-lens digital still cameras, and digital still cameras.

The invention claimed is:
1. A solid-state imaging device comprising:
a plurality of pixels arranged in rows and columns in an imaging region;
a plurality of unit cells each including n pixels from among the pixels as one unit arranged in rows and columns in the imaging region, n being a natural number greater than or equal to 2;
a row scanning unit configured to perform pixel reset scanning by scanning the pixels in the imaging region on a row basis; and
a reset scanning register for holding a parameter which is for determining the timing to complete a pixel reset operation on each of the rows and is determined according to a running quality of a mechanical curtain shutter,
wherein each of the unit cells includes:
the n pixels each including a photodiode which converts incident light into electric charges and a transfer transistor which transfers the electric charges converted by the photodiode;
a floating diffusion shared by the n pixels and holds the electric charges transferred by the transfer transistors; and
a reset transistor shared by the n pixels and resets a potential of the floating diffusion,
the pixel reset scanning is processing in which the pixel reset operation is performed on a row basis, the pixel reset operation being processing in which one of the transfer transistors and the reset transistor are turned ON to reset the photodiode corresponding to the one of the transfer transistors, and
the row scanning unit is configured to complete the pixel reset operation simultaneously on a plurality of rows to which the n pixels contained in the unit cell belong when performing the pixel reset scanning in a curtain shutter synchronous mode in which exposure of the imaging region to the incident light is started by the pixel reset scanning and ended by blocking the incident light by the mechanical curtain shutter provided on an optical path of the incident light, and
wherein, in the curtain shutter synchronous mode, the row scanning unit is configured to determine timing to complete the pixel reset operation, according to the running quality of the mechanical curtain shutter, and wherein, in the curtain shutter synchronous mode, the row scanning unit is configured to perform the pixel reset scanning based on the parameter held by the reset scanning register.

2. The solid-state imaging device according to claim 1, wherein the row scanning unit further includes:
a calculating circuit which calculates the timing to complete the pixel reset operation, using a row address value indicating a row to which the unit cell belongs and the parameter held by the reset scanning register; and
a row selection circuit which outputs a row scanning signal to the n pixels included in the unit cell so that the pixel reset operation on the n pixels included in the unit cell is completed at the timing calculated by the calculating circuit.

3. The solid-state imaging device according to claim 1, wherein, in the curtain shutter synchronous mode, the row scanning unit is configured to make a period from start to completion of the pixel reset operation on the unit cell constant for all of the pixels included in the imaging region.

4. The solid-state imaging device according to claim 1, wherein, in the curtain shutter synchronous mode, the row scanning unit is configured to simultaneously start the pixel reset operation on all of the pixels included in the imaging region.

5. The solid-state imaging device according to claim 1, wherein, in the curtain shutter synchronous mode, the row scanning unit is configured to perform part of the pixel reset operation in parallel on the pixels included in the unit cell.

6. An imaging device comprising:
the solid-state imaging device according to claim 1; and
the mechanical curtain shutter.

\* \* \* \* \*